(12) United States Patent
Lin et al.

(10) Patent No.: US 10,319,487 B2
(45) Date of Patent: Jun. 11, 2019

(54) GRAPHENE OXIDE-METAL NANOWIRE TRANSPARENT CONDUCTIVE FILM

(71) Applicant: Nanotek Instruments, Inc., Dayton, OH (US)

(72) Inventors: Yi-Jun Lin, Taoyuan (TW); Aruna Zhamu, Springboro, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 0 days.

(21) Appl. No.: 15/353,906

(22) Filed: Nov. 17, 2016

(65) Prior Publication Data

US 2017/0076833 A1   Mar. 16, 2017

Related U.S. Application Data

(62) Division of application No. 13/815,317, filed on Feb. 21, 2013, now Pat. No. 9,530,531.

(51) Int. Cl.

| H01B 1/04 | (2006.01) |
| H01B 1/08 | (2006.01) |
| H01B 1/02 | (2006.01) |
| B05D 1/00 | (2006.01) |
| B05D 1/02 | (2006.01) |
| B05D 1/04 | (2006.01) |
| B05D 1/18 | (2006.01) |
| B05D 1/12 | (2006.01) |
| C23C 4/12 | (2016.01) |
| C23C 4/04 | (2006.01) |
| B05D 1/24 | (2006.01) |
| B05D 5/12 | (2006.01) |
| H05K 3/12 | (2006.01) |

(52) U.S. Cl.
CPC ............... *H01B 1/02* (2013.01); *B05D 1/005* (2013.01); *B05D 1/02* (2013.01); *B05D 1/04* (2013.01); *B05D 1/18* (2013.01); *H01B 1/04* (2013.01); *H01B 1/08* (2013.01); *B05D 1/12* (2013.01); *B05D 1/24* (2013.01); *B05D 5/12* (2013.01); *C23C 4/04* (2013.01); *C23C 4/12* (2013.01); *H05K 3/12* (2013.01)

(58) Field of Classification Search
CPC ....... B82Y 30/00; C01B 31/0484; H01B 1/04; H01B 1/08; H01B 1/02
USPC ............. 252/500, 502, 506, 501.1, 503, 510
See application file for complete search history.

(56) References Cited

U.S. PATENT DOCUMENTS

| 2,798,878 | A | 7/1957 | Hummers et al. |
| 7,071,258 | B1 | 7/2006 | Jang et al. |
| 7,824,651 | B2 | 11/2010 | Jang et al. |
| 8,018,563 | B2 | 9/2011 | Jones et al. |
| 8,871,296 | B2 | 10/2014 | Zhamu et al. |
| 2005/0271574 | A1 | 12/2005 | Jang et al. |
| 2007/0284557 | A1 | 12/2007 | Gruner et al. |
| 2008/0048152 | A1 | 2/2008 | Jang et al. |
| 2008/0048996 | A1 | 2/2008 | Hu et al. |
| 2008/0259262 | A1* | 10/2008 | Jones ............... B82Y 10/00 349/139 |
| 2009/0017211 | A1 | 1/2009 | Gruner et al. |
| 2011/0281070 | A1 | 11/2011 | Mittal et al. |
| 2012/0270054 | A1 | 10/2012 | Hong et al. |
| 2013/0130037 | A1 | 5/2013 | Bol et al. |
| 2014/0079932 | A1 | 3/2014 | Aksay et al. |
| 2014/0190676 | A1 | 7/2014 | Zhamu et al. |
| 2014/0272199 | A1 | 9/2014 | Lin et al. |
| 2014/0313562 | A1 | 10/2014 | Ruoff et al. |

OTHER PUBLICATIONS

Pasquarelli "Solution processing of transparent conductors: from flask to film." Chem. Soc. Rev., 2011, 40, 5406-5441 (Year: 2011).*

Hecht "Emerging Transparent Electrodes Based on Thin Films of Carbon Nanotubes, Graphene, and Metallic Nanostructures." Adv. Mater. 2011, 23, 1482-1513 (Year: 2011).*

Kholmanov 2012 "Nanostructured Hybrid Transparent Conductive Films with Antibacterial properties." ACSnano,6(6),pp. 5157-5163 (Year: 2012).*

Yun "Transparent conducting films based on graphene oxide/silver nanowire hybrids with high flexibility." Synthetic Metals 162 (2012) 1364-1368 (Year: 2012).*

L. Hu, D. S. Hecht, and G. Gruner, "Percolation in Transparent and Conducting Carbon Nanotube Networks," Nano Letters, 2004, 4, 2513-2517.

Z. Wu, et al. "Transparent, Conductive Carbon Nanotube Films," Science Aug. 27, 2004: vol. 305 No. 5688 pp. 1273-1276.

H. G. Park, et al., Transparent Conductive Single Wall Carbon Nanotube Network Films for Liquid Crystal Displays, ECS Solid State Lett. Oct. 2, 2012: R31-R33.

Jung-Yong Lee , Stephen T. Connor, Yi Cui, and Peter Peumans, "Solution-Processed Metal Nanowire Mesh Transparent Electrodes," Nano Letters, 2008, 8 (2), pp. 689-692.

S. De, et al., "Silver Nanowire Networks as Flexible, Transparent, Conducting Films: Extremely High DC to Optical Conductivity Ratios," ACS Nano, 2009, 3, 1767-1774.

(Continued)

*Primary Examiner* — Tri V Nguyen

(57) ABSTRACT

A process for producing a transparent conductive film, comprising (a) providing a graphene oxide gel; (b) dispersing metal nanowires in the graphene oxide gel to form a suspension; (c) dispensing and depositing the suspension onto a substrate; and (d) removing the liquid medium to form the film. The film is composed of metal nanowires and graphene oxide with a metal nanowire-to-graphene oxide weight ratio from 1/99 to 99/1, wherein the metal nanowires contain no surface-borne metal oxide or metal compound and the film exhibits an optical transparence no less than 80% and sheet resistance no higher than 300 ohm/square. This film can be used as a transparent conductive electrode in an electro-optic device, such as a photovoltaic or solar cell, light-emitting diode, photo-detector, touch screen, electro-wetting display, liquid crystal display, plasma display, LED display, a TV screen, a computer screen, or a mobile phone screen.

22 Claims, 4 Drawing Sheets

(56) References Cited

OTHER PUBLICATIONS

Ting-Gang Chen, et al., "Flexible Silver Nanowire Meshes for High-Efficiency Microtextured Organic-Silicon Hybrid Photovoltaics," ACS Applied Materials & Interfaces, 2012, 4 (12), 6857-6864.
Taegeon Kim, et al., Electrostatic Spray Deposition of Highly Transparent Silver Nanowire Electrode on Flexible Substrate, ACS Appl. Mater. Interfaces, Article ASAP; DOI: 10.1021/am3023543.
Y. Ahn, Y. Jeong, and Y. Lee, "Improved Thermal Oxidation Stability of Solution-Processable Silver Nanowire Transparent Electrode by Reduced Graphene Oxide," ACS Applied Materials & Interfaces, 2012, 4 (12), 6410-6414.
G. Eda, et al., Large-Area Ultrathin Films of Reduced Graphene Oxide as a Transparent and Flexible Electronic Material. Nature Nanotechnology, 2008, 3, 270-274.
X. Wang, L. Zhi, and K. Mullen, Transparent, Conductive Graphene Electrodes for Dye-Sensitized Solar Cells. Nano Letters, 2008, 8, 323.
J. B. Wu, et al., "Organic Light-Emitting Diodes on Solution-Processed Graphene Transparent Electrodes," ACS Nano 2009, 4, 43-48.
S. De and J. N. Coleman, "Are There Fundamental Limitations on the Sheet Resistance and Transparence of Thin Graphene Films?" ACS Nano, May 25, 2010; 4(5), pp. 2713-2720.
K. S. Kim, et al."Large-Scale Pattern Growth of Graphene Films for Stretchable Transparent Electrodes," Nature, 2009, 457, 706-710.
X. S. Li, et al."Transfer of Large-Area Graphene Films for High-Performance Transparent Conductive Electrodes," Nano Letters, 2009, 9, 4359-4363.
A. Reina, et al. "Large Area, Few-Layer Graphene Films on Arbitrary Substrates by Chemical Vapor Deposition," Nano Letters, 2009, 9, 30-35.
Sukang Bae, et al., "Roll-to-roll production of 30-inch graphene films for transparent electrodes," Nature Nanotechnology, vol. 5, Aug. 2010, 574-578.
V. C. Tung, et al. "Low-Temperature Solution Processing of Graphene-Carbon Nanotube Hybrid Materials for High-Performance Transparent Conductors" Nano Letters, 2009, 9, 1949-1955.
I. N. Kholmanov, et al. "Improved Electrical Conductivity of Graphene Films Integrated with Metal Nanowires," Nano Letters, 2012, 12 (11), pp. 5679-5683.

* cited by examiner

GRAPHENE OXIDE-METAL NANOWIRE TRANSPARENT CONDUCTIVE FILM

CROSS REFERENCE TO RELATED APPLICATION

This application is divisional of U.S. application Ser. No. 13/815,317, filed on Feb. 21, 2013, the contents of which are incorporated by reference herein, in their entirety, for all purposes.

FIELD OF THE INVENTION

The present invention relates generally to the field of transparent conductive electrodes for solar cell, photo-detector, light-emitting diode, touch screen, and display device applications and, more particularly, to a graphene/metal nanowire-based hybrid film with a combination of exceptional optical transparency and high electrical conductivity (or low sheet resistance).

BACKGROUND OF THE INVENTION

The following references are related to the art of "transparent and conductive electrodes":
1. L. Hu, D. S. Hecht, and G. Gruner, "Percolation in Transparent and Conducting Carbon Nanotube Networks," *Nano Letters,* 2004, 4, 2513-2517.
2. Z. Wu, et al. "Transparent, Conductive Carbon Nanotube Films," *Science* 27 Aug. 2004: Vol. 305 no. 5688 pp. 1273-1276.
3. H. G. Park, et al., "Transparent Conductive Single Wall Carbon Nanotube Network Films for Liquid Crystal Displays, ECS Solid State Lett. 2 Oct. 2012: R31-R33.
4. Jung-Yong Lee, Stephen T. Connor, Yi Cui, and Peter Peumans, "Solution-Processed Metal Nanowire Mesh Transparent Electrodes," *Nano Letters,* 2008, 8 (2), pp 689-692.
5. S. De, et al., "Silver Nanowire Networks as Flexible, Transparent, Conducting Films: Extremely High DC to Optical Conductivity Ratios," *ACS Nano,* 2009, 3, 1767-1774.
6. Ting-Gang Chen, et al., "Flexible Silver Nanowire Meshes for High-Efficiency Microtextured Organic-Silicon Hybrid Photovoltaics," *ACS Applied Materials & Interfaces,* 2012, 4 (12), 6857-6864.
7. Taegeon Kim, et al., "Electrostatic Spray Deposition of Highly Transparent Silver Nanowire Electrode on Flexible Substrate, *ACS Appl. Mater. Interfaces*, Article ASAP; DOI: 10.1021/am3023543.
8. Y. Ahn, Y. Jeong, and Y. Lee, "Improved Thermal Oxidation Stability of Solution-Processable Silver Nanowire Transparent Electrode by Reduced Graphene Oxide," *ACS Applied Materials & Interfaces,* 2012, 4 (12), 6410-6414.
9. G. Gruner, L. Hu, and D. Hecht, "Graphene Film as Transparent and Electrically Conductive Material," US Patent Pub. No. 2007/0284557 (Dec. 13, 2007).
10. L. Hu, et al., "Touch Screen Devices Employing Nanostructure Network," US Patent Pub. No. 2008/0048996 (Feb. 28, 2008).
11. G. Gruner, et al.; "Graphene Film as Transparent and Electrically Conductive Material," US Patent Pub. No. 2009/0017211 (Jan. 15, 2009).
12. G. Eda, et al., "Large-Area Ultrathin Films of Reduced Graphene Oxide as a Transparent and Flexible Electronic Material. *Nature Nanotechnology,* 2008, 3, 270-274.
13. X. Wang, L. Zhi, and K. Mullen, "Transparent, Conductive Graphene Electrodes for Dye-Sensitized Solar Cells. *Nano Letters,* 2008, 8, 323.
14. J. B. Wu, et al., "Organic Light-Emitting Diodes on Solution-Processed Graphene Transparent Electrodes," *ACS Nano* 2009, 4, 43-48.
15. S. De and J. N. Coleman, "Are There Fundamental Limitations on the Sheet Resistance and Transparence of Thin Graphene Films?" *ACS Nano,* 2010 May 25; 4(5), pp. 2713-20.
16. K. S. Kim, et al. "Large-Scale Pattern Growth of Graphene Films for Stretchable Transparent Electrodes," *Nature,* 2009, 457, 706-710.
17. X. S. Li, et al. "Transfer of Large-Area Graphene Films for High-Performance Transparent Conductive Electrodes," *Nano Letters,* 2009, 9, 4359-4363.
18. A. Reina, et al. "Large Area, Few-Layer Graphene Films on Arbitrary Substrates by Chemical Vapor Deposition," *Nano Letters,* 2009, 9, 30-35.
19. Sukang Bae, et al., "Roll-to-roll production of 30-inch graphene films for transparent electrodes," *Nature Nanotechnology*, Vol. 5, August 2010, 574-578.
20. V. C. Tung, et al. "Low-Temperature Solution Processing of Graphene-Carbon Nanotube Hybrid Materials for High-Performance Transparent Conductors" *Nano Letters,* 2009, 9, 1949-1955.
21. I. N. Kholmanov, et al. "Improved Electrical Conductivity of Graphene Films Integrated with Metal Nanowires," Nano Letters, 2012, 12 (11), pp 5679-5683.

Optically transparent and electrically conductive electrodes are widely implemented in optoelectronic devices, such as photovoltaic (PV) or solar cells, light-emitting diodes, organic photo-detectors, and various display devices. For use in these applications, the electrode materials must exhibit both exceptionally high optical transmittance and low sheet resistance (or high electrical conductivity). More commonly used transparent and conductive oxides (TCO) for the electrodes in these devices include (a) indium tin oxide (ITO), which is used for organic solar cells and light-emitting diodes, and (b) Al-doped ZnO, which is used in amorphous solar cells. There are some alternatives to these TCO that are being considered, such as single-walled carbon nanotubes (CNT), graphene, and metal or metal nanowires (NW).

Discrete carbon nanotubes may be used to form a thin film of highly porous network (or mesh) of electron-conducting paths on an optically transparent substrate, such as glass or polymer (e.g., polyethylene terephthalate, PET or polycarbonate). The empty spaces between nanotubes allow for light transmission and the physical contacts between nanotubes form the required conducting paths [Refs. 1-3]. However, there are several major issues associated with the use of CNTs for making a transparent conductive electrode (TCE). For instance, a higher CNT content leads to a higher conductivity, but lower transmittance due to a lower amount of empty spaces. Further, the sheet resistances of CNT-based electrodes are dominated by the large CNT junction resistances due to the mixed carbon nanotube varieties, with $\frac{1}{3}$ being metallic and $\frac{2}{3}$ semiconducting. As a result, a typical sheet resistance of CNT networks on a plastic substrate is 200-1,000 ohms/square ($\Omega/\Box$) at an optical transmittance of 80-90%. The relatively high sheet resistance, compared with the approximately 10-50 ohms/square of high-end ITO on a plastic substrate, is far from being adequate for the practical application of transparent CNT electrodes in current-based devices, such as organic light emitting diodes and solar cells. Furthermore, an optical transmittance of >90% is generally required for these devices. Even for voltage-driven devices, such as capacitive touch screens, electro-wetting displays, and liquid crystal displays, a relatively low sheet resistance is highly desirable.

Metal nanowire mesh-based conductive and transparent films are also being considered as a potential replacement for ITO [Refs. 4-8]. However, metal nanowires also suffer from the same problems as CNTs. For instance, although individual metal nanowires (e.g. Ag nanowires) can have a high electrical conductivity, the contact resistance between metal nanowires can be significant. Additionally, although Ag nanowire films can show good optical and electrical performance, it has been difficult to make Ag nanowires into a free-standing thin film or a thin film of structural integrity coated on a substrate. In particular, Ag nanowire films that are deposited on a plastic substrate exhibit unsatisfactory flexibility and mechanical stability in that the nanowires can easily come off. Also, the surface smoothness is poor (surface roughness being too large).

Furthermore, all metal nanowires still have a long-term stability issue, making them unacceptable for practical use. When Ag nanowire films are exposed to air and water, Ag nanowires can be easily oxidized, leading to sharp increase in sheet resistance and hazeness of the films. Ahn, et al [Ref. 8] disclosed the deposition of a reduced graphene oxide (RGO) layer or multiple RGO layers to a pre-fabricated Ag nanowire layer. The intent was to protect the underlying Ag nanowire film, but this approach can introduce additional issues to the film, e.g. significantly reduced optical transmittance by carrying out multiple coating passes and increased sheet resistance (when the Ag nanowire film was coated with more than 3 passes).

Graphene is yet another potential alternative to ITO. An isolated plane of carbon atoms organized in a hexagonal lattice is commonly referred to as a single-layer graphene sheet. Few-layer graphene refers to a stack of up to 5-10 planes of hexagonal carbon atoms bonded along the thickness direction with van der Waals forces. The generally good optical transparency and good electrical conductivity of graphene have motivated researchers to investigate graphene films for transparent and conductive electrode (TCE) applications [Refs. 9-21].

For instance, Gruner et al [Refs. 9-11] suggested a transparent and conductive film comprising at least one network of "graphene flakes," which are actually very thick graphite flakes. A suspension of graphite flakes in a solvent was deposited onto a transparent glass, allowing isolated graphite flakes to somehow overlap one another to form a mesh (e.g. FIG. 1 of Ref. 9 and FIG. 1 of Ref 11). The empty spaces between graphite flakes permit the light to pass through. However, these films typically exhibit a sheet resistance as high as 50 kOhm/square ($5 \times 10^4 \Omega/\square$) at 50% transparency. The low transparency is a result of using thick graphite flakes, not graphene sheets. Gruner et al then attempted to improve the film performance by combining carbon nanotubes and graphite flakes to form an interpenetrating network of conductive pathways (e.g. FIG. 2 of Ref. 9 and FIG. 2 of Ref. 11). Unfortunately, the interpenetrating network of graphite flakes and carbon nanotubes lead to a film that is only 80% transparent at 2 kOhms/square or 65% transparent at 1 kOhms/square (e.g., paragraph [0026] in both Ref. 9 and Ref. 11). These values are absolutely unacceptable to the TCE industry.

In a graphene film made by metal-catalyzed chemical vapor deposition (CVD), each graphene plane loses 2.3-2.7% of the optical transmittance and, hence, a five-layer graphene sheet or a film with five single-layer graphene sheets stacked together along the thickness direction would likely have optical transmittance lower than 90%. Unfortunately, single-layer or few layer graphene films, albeit optically transparent, have a relatively high sheet resistance, typically $3 \times 10^2$-$10^5$ Ohms/square (or 0.3-100 k$\Omega$/$\square$). The sheet resistance is decreased when the number of graphene planes in a film increases. In other words, there is an inherent tradeoff between optical transparency and sheet resistance of graphene films: thicker films decrease not only the film sheet resistance but also the optical transparency.

A recent study [Ref. 19] has demonstrated that single-layer CVD graphene films can have sheet resistances as low as ~125$\Omega$/$\square$ with 97.4% optical transmittance. However, the sheet resistance is still lower than desirable for certain applications. The authors further used layer-by-layer stacking to fabricate a doped four-layer film that shows sheet resistance at values as low as ~30$\Omega$/$\square$ at ~90% transparency, which is comparable to those of certain ITO grades. However, the layer-by-layer procedure is not amenable to mass production of transparent conductive electrodes for practical uses. Doping also adds an extra level of complexity to an already highly complex and challenging process that requires a tight vacuum or atmosphere control. The CVD process and equipment are notoriously expensive. Strong and urgent needs exist for more reliable and lower-cost processes and/or TCE materials that exhibit outstanding performance (e.g. sheet resistance <30-40$\Omega$/$\square$, yet still maintaining a transparency no less than 90%).

Since both graphene and carbon nanotube (CNT) have carbon atoms as the primary element, it is appropriate to briefly discuss carbon-based materials at this juncture. Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Bulk natural flake graphite is a 3-D graphitic material with each particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

The constituent graphene planes of a graphite crystallite can be exfoliated and extracted (or isolated) to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness). When the platelet has up to 5-10 graphene planes, it is commonly referred to as "few-layer graphene" in the scientific community. Single-layer graphene and multi-layer graphene sheets are collectively called "nano graphene platelets" (NGPs). Graphene sheets/platelets (NGPs) are a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

It may be noted that NGPs include discrete sheets/platelets of single-layer and multi-layer pristine graphene, graphene oxide, or reduced graphene oxide with different oxygen contents. Pristine graphene has essentially 0% oxygen. Graphene oxide (GO) has 0.01%-46% by weight of oxygen and reduced graphene oxide (RGO) has 0.01%-2.0% by weight of oxygen. In other words, RGO is a type of GO having lower but non-zero oxygen content. Additionally, both GO and RGO contain a high population of edge- and surface-borne chemical groups, vacancies, oxidative traps, and other types of defects, and both GO and RGO contain oxygen and other non-carbon elements, e.g. hydrogen [Ref. 14; J. B. Wu, et al]. In contrast, the pristine graphene sheets are practically defect-free and contain no oxygen. Hence, GO and RGO are commonly considered in the scientific community as a class of 2-D nano material that is fundamentally different and distinct from pristine graphene.

It may be further noted that CVD graphene films, although relatively oxygen-free, tend to contain a significant amount of other non-carbon elements, such as hydrogen and nitrogen. The CVD graphene is polycrystalline and contains many defects, e.g., grain boundaries, line defects, vacancies, and other lattice defects, such as those many carbon atoms configured in pentagons, heptagons, or octagons, as opposed to the normal hexagon. These defects impede the flow of electrons and phonons. For these reasons, the CVD graphene is not considered as pristine graphene in the scientific community.

Pristine graphene can be produced by direct ultrasonication or liquid phase production, supercritical fluid exfoliation, direct solvent dissolution, alkali metal intercalation and water-induced explosion of natural graphite particles, or more expensive epitaxial growth. Pristine graphene is normally single-grain or single-crystalline, having no grain boundaries. Further, pristine graphene essentially does not contain oxygen or hydrogen. However, if so desired, the pristine graphene can be optionally doped with a chemical species, such as boron or nitrogen, to modify its electronic and optical behavior in a controlled manner.

A hybrid material containing both graphene oxide and CNT was formed into a thin film by Tung et al [Ref. 20], but the film does not exhibit a satisfactory balance of optical transparency and electrical conductivity. The highest performance film shows optical transmittance of 92%, but this is achieved at an unacceptable sheet resistance of 636Ω/□. The film with the lowest sheet resistance (240Ω/□ with un-doped RGO) shows 60% optical transmittance, which is not useful at all. The graphene component was prepared from heavily oxidized graphite, which was then intensely reduced with hydrazine.

Another hybrid material, containing non-pristine graphene (obtained by CVD) and silver nanowires, was formed into a film [Ref. 22]. Again, CVD-grown graphene is a polycrystalline material (not single-crystalline and not pristine) with many topological defects, such as non-hexagonal carbon atoms, vacancies, dislocations, and grain boundaries. Grain boundaries in graphene are line defects at the interfaces between two domains with different crystallographic orientations. Due to the processing conditions inherent to the CVD process, the CVD graphene also contains non-carbon elements (e.g. hydrogen) and non-hexagonal carbon atoms. All these characteristics (defects and impurities) can significantly impede the transport of electrons and phonons in CVD graphene films. Even with the help from silver nanowires, the best CVD graphene-AgNW hybrid film exhibits a sheet resistance value that is still far away from what can be theoretically achieved with graphene alone [Ref. 22]. Besides, CVD processes are slow and expensive.

As discussed above, the CNT mesh, metal nanowire mesh, CVD graphene film, GO film (including RGO film), CNT-graphite flake mesh, CNT-graphene oxide (GO) hybrid, and RGO-protected Ag nanowire mesh have been proposed to serve as a transparent and conductive electrode, but none has met the stringent combined requirements of transparency, conductivity, oxidation resistance or long-term stability, mechanical integrity and flexibility, surface quality, chemical purity, process ease, and low cost.

Thus, it is an object of the present invention to provide a graphene oxide gel-derived hybrid film containing metal nanowires that meets most or all of the aforementioned requirements. The graphene oxide gel unexpectedly acts to remove the otherwise readily formed metal oxide or other metal compounds that are highly insulating and lead to an extremely high contact resistance.

It is another object of the present invention to provide a process for producing a graphene oxide gel-derived hybrid film (containing graphene oxide or reduced graphene oxide) that is a variable alternative to ITO. Surprisingly, this process inherently removes metal oxide or metal compounds that automatically form on the surface of metal nanowires (e.g. Ag and Cu nanowires) when exposed to open air. This process also enables the coverage of metal nanowires (after removal of metal oxide or other metal compounds) with the RGO film, preventing the surface of metal nanowires from re-exposing to open air or any other oxidizing environment.

SUMMARY OF THE INVENTION

The present invention provides a process for producing an optically transparent and electrically conductive film. The process comprises: (a) providing a graphene oxide gel prepared from oxidation of a graphitic material in an oxidizing medium wherein the graphene oxide gel contains graphene oxide molecules dissolved in a liquid medium; (b) dispersing metal nanowires in the graphene oxide gel to form a suspension; (c) dispensing and depositing the suspension onto a supporting substrate; and (d) removing the liquid medium from the suspension to form the desired optically transparent and electrically conductive film. This film is composed of metal nanowires and graphene oxide (GO or RGO) with a metal nanowire-to-graphene oxide weight ratio of from 1/99 to 99/1, wherein the metal nanowires contain no surface-borne metal oxide or metal compound and the film exhibits an optical transparence no less than 80% and sheet resistance no higher than 300 ohm/square.

Graphene oxide gel can be produced by dispersing graphite particles in an oxidizing liquid (e.g. mixture of strong sulfuric acid, nitric acid, and potassium permanganate) for a sufficient length of time. The original graphite particles can be heavily oxidized, to the extent that practically every one of the original graphene planes has been oxidized and isolated from one another to become individual molecules that possess highly reactive functional groups at the edge and, mostly, on graphene planes as well. These individual hydrocarbon molecules (containing elements such as O and H, not just carbon atoms) are dissolved in the reaction medium (e.g. mixture of water and acids) to form a gel-like mass, herein referred to as GO gel.

We have most surprisingly observed that GO gel appears to be a good reducing agent or cleaning agent, capable of removing metal oxide or other metal compound from metal nanowire surfaces. These metal oxide or metal compounds are electrically insulating, preventing intimate metal-to-metal contacts when these nanowires are deposited to form wire meshes and also preventing metal-to-graphene contacts when these nanowires are co-deposited with a graphene material using a conventional process. Instead, by immersing metal nanowires in GO gel, these metal oxides or compounds are removed, enabling intimate metal-to-metal contacts and metal-to-graphene contacts when the metal nanowire-graphene oxide gel suspension is deposited and dried.

In general, the graphene oxide gel is composed of graphene oxide molecules dispersed in an acidic medium having a pH value of no higher than 5 and the graphene oxide molecules have an oxygen content no less than 20% by weight while in a gel state.

The GO gel is obtained by immersing a graphitic material in a powder or fibrous form (e.g. natural or artificial graphite powder or graphite fibers) in an oxidizing liquid medium in a reaction vessel at a reaction temperature for a length of time sufficient to obtain a graphene oxide gel composed of graphene oxide molecules dispersed in the liquid medium. The graphene oxide molecules preferably and typically have an oxygen content no less than 20% by weight (typically 20%-46% by weight of oxygen) and a molecular weight less than 43,000 g/mole while in a gel state. Preferably, graphene oxide molecules have a molecular weight less than 4,000 g/mole while in a gel state, more preferably between 200 g/mole and 4,000 g/mole while in a gel state.

The starting materials for the preparation of graphene oxide gel can include a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. Typically, when graphite particles are immersed in an oxidizing agent, the resulting suspension is initially optically opaque. As the oxidizing reaction proceeds to a critical extent, an optically transparent or translucent solution is formed. This graphene oxide gel has the characteristics that it is visually homogeneous with no discernible discrete graphene or graphene oxide sheets dispersed therein. In contrast, conventional suspension of discrete graphene or graphene oxide sheets, or graphite flakes dispersed in a liquid like water looks opaque, dark, black or heavy brown in color with individual graphene sheets, graphene oxide sheets, or graphite flakes being discernible or recognizable with naked eyes.

The graphene oxide molecules dissolved in the liquid medium of a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. These benzene-ring type of aromatic molecules have been heavily oxidized and contain functional groups, such as —COOH and —OH and, therefore, are "soluble" (not just dispersible) in polar solvents, such as water.

These soluble molecules behave like resins and are surprisingly capable of forming a coherent layer of graphene oxide of good structural integrity and high thermal conductivity. By contrast, conventional discrete graphene or graphene oxide sheets (including RGO sheets) in solid powder form and graphite flakes do not have any self-adhesion or cohesion power. These sheets or flakes are not living molecules and are relatively inactive or chemically inert.

The graphene oxide (including RGO) produced herein via GO gel route is typically single-layer graphene but can contain some few-layer graphene (up to 10 planes of carbon atoms, but more typically up to 5 planes). It is important to point out that the number of graphene planes of atoms (i.e. the number of hexagonal planes of carbon atoms) in a graphene platelet is an essential factor that differentiates one type of graphene from another type. A single-layer graphene is a semi-metal with a zero energy gap. A double-layer graphene sheet/platelet is a semiconductor with a non-zero energy gap. As the number of graphene planes increases from 3 to 10 layers, the graphene material is transitioned from a semiconductor to a metal (or conductor). Hence, single-layer graphene, double-layer graphene, few-layer graphene (3-10 layers), and thicker graphene platelets (>10 layers) are all considered as distinct and different types of materials in scientific community.

Preferably and typically, a thin film (preferably <5 nm and more preferably <2 nm) containing GO gel-derived RGO and metal nanowires exhibits an optical transparence no less than 85% and sheet resistance no higher than 300 ohm/square. More preferably and more typically, the film exhibits an optical transparence no less than 85% and sheet resistance no higher than 200 ohm/square (preferably no higher than 100 ohm/square). Still more preferably and typically, the film exhibits an optical transparence no less than 90% and sheet resistance no higher than 200 ohm/square (preferably no higher than 100 ohm/square and further preferably no higher than 50 ohm/square). In many cases, the film exhibits an optical transparence no less than 95% at a sheet resistance no higher than 100 ohm/square (often no higher than 50 ohm/square).

Most surprisingly, some of our best films derived from GO gel achieve a sheet resistance of 63 ohm/square at 95% transparence and 74 ohm/square at 97% transparency. The lowest sheet resistance achieved with GO-derived films thus far has been 19 ohm/square. These performance levels are outstanding and have exceeded the very best values of all graphene oxide-based hybrid material films ever reported. These values are comparable to those of ITO-based films, yet the presently invented graphene-based hybrid films are flexible, durable, mechanical strong, environmentally stable, and potentially much less expensive.

For the purpose of defining the claim languages, the "metal nanowire" in the instant application refers to an elongated metal nanostructure having a largest dimension (e.g. length) and a smallest dimension (e.g. thickness or diameter) wherein the largest dimension-to-smallest dimension ratio is no less than 3 and the smallest dimension is no greater than 200 nm (preferably no greater than 100 nm). The metal nanowire refers to a metal nanostructure having a rod, wire, sheet, belt, or tube shape that meets the aforementioned dimension requirements. In other words, the metal nanowire can include nano-rod, nano-wire, nano-sheet, nano-belt, or nano-tube.

In a preferred embodiment, the metal nanowires are selected from nanowires of silver (Ag), gold (Au), copper (Cu), platinum (Pt), zinc (Zn), cadmium (Cd), cobalt (Co), molybdenum (Mo), aluminum (Al), an alloy thereof, or a combination thereof. Particularly desired metal nanowires are silver nanowires, but metal nanowires may be selected from nanowires of a transition metal or an alloy of a transition metal.

The optically transparent and electrically conductive film may be a free-standing film or supported on a transparent substrate. In a preferred configuration, the film is supported on a transparent substrate and the mesh or meshes of metal nanowires are embedded in the RGO derived from GO gel.

The hybrid metal nanowire/RGO-based optically transparent and electrically conductive film may further contain carbon nanotubes or carbon nano-fibers.

The present invention also provides an optically transparent and electrically conductive film produced by the process described above. In one embodiment, this film is composed of metal nanowires and graphene oxide (including reduced graphene oxide) having a metal nanowire-to-graphene oxide weight ratio of from 1/9 to 9/1, wherein the metal nanowires contain no surface-borne metal oxide or metal compound and said film exhibits an optical transparence no less than 80% and sheet resistance no higher than 200 ohm/square (preferably no higher than 100 ohm/square). The film may further contain carbon nanotubes or carbon nano-fibers.

The invention further provides an electro-optic device containing an optically transparent and electrically conductive film herein produced as an electrode. The electro-optic device may be a photovoltaic or solar cell, light-emitting diode, photo-detector, touch screen, electro-wetting display, liquid crystal display, plasma display, LED display, a TV screen, a computer screen, or a mobile phone screen.

DESCRIPTION OF THE PREFERRED EMBODIMENTS

Figure 1A:
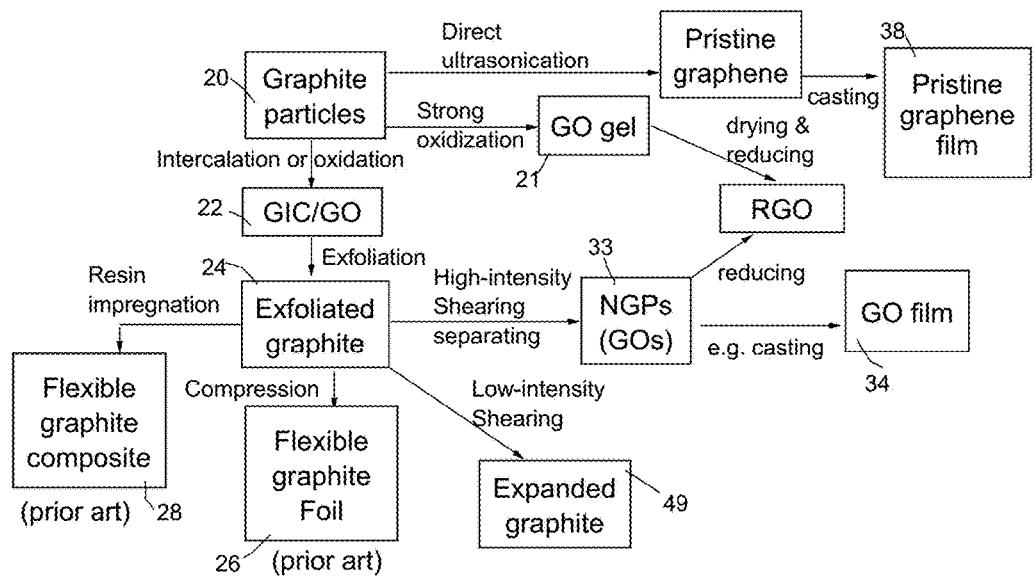
FIG. 1(a) A flow chart illustrating various prior art processes for producing nano graphene platelets (graphene oxide, reduced graphene oxide, and pristine graphene) and exfoliated graphite products (flexible graphite foils and flexible graphite composites); (b) Schematic drawing illustrating the processes for producing a film or membrane of simply aggregated graphite or NGP flakes/platelets; all processes begin with intercalation and/or oxidation treatment of graphitic materials (e.g. natural graphite particles).

A preferred embodiment of the present invention is a process for producing an optically transparent and electrically conductive film composed of a mixture or hybrid of metal nanowires and graphene oxide (GO) or reduced graphene oxide (RGO) derived from GO gel. The metal nanowire-to-graphene oxide (or RGO) weight ratio in this mixture is from 1/99 to 99/1. The film exhibits an optical transparence no less than 80% and sheet resistance no higher than 300 ohm/square. The film is typically thinner than 1 µm, more often thinner than 100 nm, even more often and preferably thinner than 10 nm, most often thinner than 1 nm, and can be as thin as 0.34 nm. The metal nanowires contain no surface-borne metal oxide or metal compound that otherwise are electrically insulating.

As a preferred embodiment, the process comprises: (a) providing a graphene oxide gel prepared from oxidation of a graphitic material in an oxidizing medium wherein the graphene oxide gel contains graphene oxide molecules dissolved in a liquid medium; (b) dispersing metal nanowires in the graphene oxide gel to form a suspension; (c) dispensing and depositing the suspension onto a supporting substrate; and (d) removing the liquid medium from the suspension to form the desired optically transparent and electrically conductive film.

The two key components in this transparent and conductive film are metal nanowires (e.g. silver nanowires, AgNW) and GO (or RGO). This GO or RGO is derived from GO gel, which will be described first.

Graphene normally refers to a sheet of carbon atoms that are arranged in a hexagonal lattice and the sheet is one carbon atom thick. This isolated, individual plane of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness). When the platelet has up to 5-10 graphene planes, it is commonly referred to as "few-layer graphene" in the scientific community. Single-layer graphene and multi-layer graphene sheets are collectively called "nano graphene platelets" (NGPs). Graphene sheets/platelets or NGPs are a new class of carbon nano material (a 2-D nano carbon) that is distinct from the 0-D fullerene, the 1-D CNT, and the 3-D graphite.

In the instant application and in keeping with commonly accepted definitions in scientific community, NGPs or graphene materials can include discrete sheets/platelets of single-layer and multi-layer pristine graphene, graphene oxide, or reduced graphene oxide with different oxygen contents. Pristine graphene has essentially 0% oxygen and 0% hydrogen. Graphene oxide (GO) has 0.01%-46% by weight of oxygen and reduced graphene oxide (RGO) has 0.01%-2.0% by weight of oxygen. In other words, RGO is a type of GO having lower but non-zero oxygen content. Additionally, both GO and RGO contain a high population of edge- and surface-borne chemical groups, vacancies, oxidative traps, and other types of defects, and both GO and RGO contain oxygen and other non-carbon elements, e.g. hydrogen. In contrast, the pristine graphene sheets are practically defect-free on the graphene plane and contain no oxygen. Hence, GO and RGO are commonly considered in the scientific community as a class of 2-D nano material that is fundamentally different and distinct from pristine graphene.

Figure 1B:
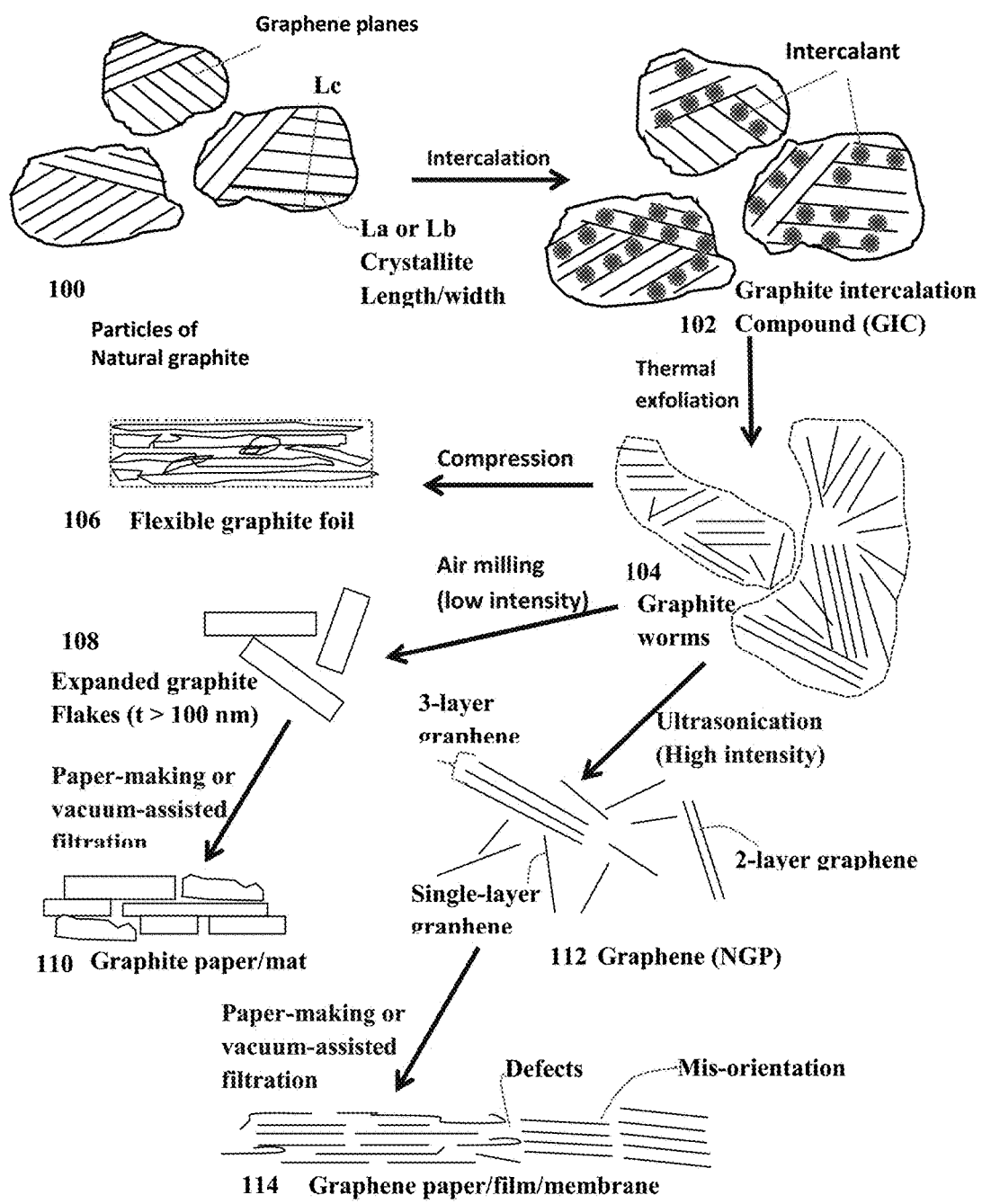

NGPs are commonly obtained by intercalating natural graphite particles with a strong acid and/or oxidizing agent to obtain a graphite intercalation compound (GIC) or graphite oxide (GO), as illustrated in FIG. 1(a) (process flow chart) and FIG. 1(b) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the crystallographic c-axis direction. The GIC or GO is most often produced by immersing natural graphite powder (20 in FIG. 1(a) and 100 in FIG. 1(b)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. Strong oxidation of graphite particles can result in the formation of a gel-like state called "GO gel" 21. The GIC 22 is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the graphite oxide suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid expansion by a factor of 30-300 to form "graphite worms" (24 or 104), which are each a collection of exfoliated, but largely un-separated graphite flakes that remain interconnected.

In Route 1A, these graphite worms (exfoliated graphite or "networks of interconnected/non-separated graphite flakes") can be re-compressed to obtain flexible graphite sheets or foils (26 or 106) that typically have a thickness in the range of 0.1 mm (100 μm)-0.5 mm (500 μm). Alternatively, one may choose to use a low-intensity air mill or shearing machine to simply break up the graphite worms for the purpose of producing the so-called "expanded graphite flakes" (49 or 108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils are completely opaque and cannot be used as a transparent electrode.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is typically less than 20 nm. The NGPs (still containing oxygen) may be dispersed in a liquid medium and cast into a GO thin film 34.

Route 2 entails ultrasonicating the graphite oxide suspension for the purpose of separating/isolating individual graphene oxide sheets from graphite oxide particles. This is based on the notion that the inter-graphene plane separation bas been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.01%-10% by weight, more typically 0.01%-5% by weight, and most typically 0.01%-2.0% by weight of oxygen with heavy chemical reduction using a reducing agent like hydrazine. In the scientific community, the chemically processed graphene-based transparent and conductive electrode normally refers to the RGO produced in this manner (as opposed to CVD deposited).

It is important to further emphasize the fact that, in the typical prior art processes, ultrasonification is used after intercalation and oxidation of graphite (i.e., after first expansion) and most typically after thermal shock exposure of the resulting GIC or GO (i.e., after second expansion or exfoliation) to aid in breaking up those graphite worms. There are already much larger spacings between flakes after intercalation and/or after exfoliation (hence, making it possible to easily separate flakes by ultrasonic waves). This ultrasonication was not perceived to be capable of separating those un-intercalated/un-oxidized layers where the inter-graphene spacing remains <0.34 nm and the van der Waals forces remain strong.

The applicant's research group was the very first in the world to surprisingly observe that, under proper conditions (e.g., with an ultrasonic frequency and intensity and under the assistance of a certain type of surfactant), ultrasonication can be used to produce ultra-thin graphene directly from graphite, without having to go through chemical intercalation or oxidation. This invention was reported in a patent application [A. Zhamu, et al., "Method of Producing Exfoliated Graphite, Flexible Graphite, and Nano Graphene Plates," U.S. patent Ser. No. 11/800,728 (May 8, 2007); now U.S. Pat. No. 7,824,651 (Nov. 2, 2010)]. This "direct ultra-sonication" process is capable of producing both single-layer and few-layer pristine graphene sheets. This innovative process involves simply dispersing pristine graphite powder particles 20 in a liquid medium (e.g., water, alcohol, or acetone) containing a dispersing agent or surfactant to obtain a suspension. The suspension is then subjected to an ultrasonication treatment, typically at a temperature between 0° C. and 100° C. for 10-120 minutes, resulting in ultra-thin pristine graphene sheets suspended in a liquid medium. The resulting suspension can be cast to form a pristine graphene film 38. No chemical intercalation or oxidation is required. The graphite material has never been exposed to any obnoxious chemical. This process combines expansion, exfoliation, and separation into one step. Hence, this simple yet elegant method obviates the need to expose graphite to a high-temperature, or chemical oxidizing environment. Upon drying, the resulting NGPs are essentially pristine graphene, containing no oxygen and no surface defects. These pristine graphene sheets, single-layer or multi-layer, are all highly conductive both electrically and thermally.

The graphene oxide gel is a very unique and novel class of material that surprisingly has great cohesion power (self-bonding, self-polymerizing, and self-crosslinking capability) and adhesive power (capable of chemically bonding to a wide variety of solid surfaces). These characteristics have not been taught or hinted in the prior art. The GO gel is obtained by immersing powders or filaments of a starting graphitic material in an oxidizing liquid medium (e.g. a mixture of sulfuric acid, nitric acid, and potassium permanganate) in a reaction vessel. The starting graphitic material may be selected from natural graphite, artificial graphite, meso-phase carbon, meso-phase pitch, meso-carbon microbead, soft carbon, hard carbon, coke, carbon fiber, carbon nano-fiber, carbon nano-tube, or a combination thereof.

When the starting graphite powders or filaments are mixed in the oxidizing liquid medium, the resulting slurry initially appears completely dark and opaque. When the oxidation of graphite proceeds at a reaction temperature for a sufficient length of time under a controlled pH condition, the reacting mass can eventually turn optically translucent or transparent, which also looks and behaves like a gel. This heavy oxidation-induced graphene oxide gel is composed of graphene oxide molecules dispersed in the liquid medium. The graphene oxide molecules, prior to any subsequent heat treatment, have an oxygen content no less than 20% by weight (typically from 40-50% by weight) and their molecular weights are typically less than 43,000 g/mole (often less than 4,000 g/mole, but typically greater than 200 g/mole) while in a gel state. The graphene oxide gel is composed of graphene oxide molecules dispersed in an acidic medium having a pH value of typically no higher than 5.

This gel state can be converted to a solid state via adding a chemical reducing agent (e.g. hydrazine or sodium boron hydride) to reduce the GO molecules to RGO sheets, which precipitate out of the liquid medium. Upon removal of the liquid, the resulting product is RGO powder. Alternatively, the GO gel can be just boiled for an extended period of time (e.g. >1 hour) to precipitate out the partially reduced GO. By removing the liquid component one obtains the partially reduced GO, which can be further heat-treated to produce fully reduced RGO. The RGO powder produced by either approach can be re-dispersed in a solvent with the assistance of a surfactant or dispersing agent to form a suspension, which can be cast or spin-coated to form RGO films. Initially, these commonly accepted procedures were what we used to prepare thin RGO films or RGO-protected metal nanowire films. However, the sheet resistance and optical transparency of the films produced in this manner were not satisfactory.

We then decided to undertake a drastically different approach. In this novel approach, we began with the preparation of GO gel, but we did not thermally or chemically reduce the GO gel prior to mixing metal nanowires into the GO gel. Instead, we mixed metal nanowires into GO gel prior to GO reduction or removal of liquid from GO gel. This strategy allows metal nanowires to interact with the living GO molecules in the gel state. The original intent was to provide an environment that was conducive to the formation of a strong bond between metal nanowires and the GO sheets when the GO was subsequently reduced. Indeed, we were able to accomplish this original goal (of having strong interfacial bonds between metal nanowires and GO sheets). However, quite surprisingly, this approach also led to an unexpected result that the metal nanowire-RGO films exhibited an outstanding combination of high transparency and low sheet resistance, significantly better than those of the corresponding metal nanowire-RGO films prepared earlier (i.e., those films prepared through reduction of GO first and then mixing the resulting RGO with metal nanowires).

After this surprising discovery, we proceeded to conduct some analysis to gain an understanding why the GO gel route was so powerful. Chemical analyses have demonstrated that prior to immersion into GO gel, silver nanowires had a thin but finite layer (scale) of silver oxide. By immersing these silver nanowires in GO gel for 2 hours or longer, the silver oxide scale disappeared. Untreated copper nanowires also showed some copper oxide and copper chloride compound, which were removed upon immersion in GO gel at a temperature higher than 23° C. for 0.5-2 hours. Removal of the insulating scale from metal nanowire surfaces enables intimate metal-to-graphene and metal-to-metal contacts with minimal contact resistance. This is likely a major reason for the observed performance of GO gel-derived thin films.

There are many processes, with or without a template, that can be used to produce metal nanowires, and these are well known in the art. A widely used approach to fabricate metal nanowires is based on the use of various templates, which include negative, positive, and surface step templates. Negative template methods use prefabricated cylindrical nanopores in a solid material as templates. By depositing metals into the nano-pores, nanowires with a diameter predetermined by the diameter of the nano-pores are fabricated.

The positive template method uses wire-like nanostructures, such as DNA and carbon nanotubes as templates, and nanowires are formed on the outer surface of the templates. Unlike negative templates, the diameters of the nanowires are not restricted by the template sizes and can be controlled by adjusting the amount of materials deposited on the templates. By removing the templates after deposition, wire-like and tube-like structures can be formed.

Atomic-scale step edges on a crystal surface can be used as templates to grow nanowires. The method takes advantage of the fact that deposition of many materials on a surface often starts preferentially at defect sites, such as surface step-edges. For this reason, the method is sometimes called "step edge decoration." As examples, several research groups prepared metal nanowires on vicinal single crystal surfaces using the physical vapor deposition (PVD) method. Others fabricated metal nanowires of 1-2 atomic layer thick with a controlled "width" and wire spacing.

Metal nanowires (optionally containing other conductive additives, such as CNTs and carbon nano-fibers) may be dispersed in a GO gel. The resulting suspension is then dispensed and deposited onto a solid substrate. As a control sample, GO or RGO platelets may be dispersed in a liquid medium (e.g. water) with or without a surfactant to form a suspension or ink. Metal nanowires are then mixed into this non-GO gel suspension, which is then dispensed and deposited onto a supporting substrate. As another control samples, metal nanowire suspension is deposited onto a supporting substrate to form a thin film or mesh of nanowires. This nanowire thin film is then covered with a subsequently deposited RGO film (not from the GO gel route). The results are quite striking, as further discussed in the examples presented toward the end of the section.

The surface of many metal nanowires can be effectively cleaned by using GO gel. Examples include silver (Ag), gold (Au), copper (Cu), platinum (Pt), zinc (Zn), cadmium (Cd), cobalt (Co), molybdenum (Mo), aluminum (Al), and their alloys.

The RGO-, metal nanowire-, RGO-metal nanowire, and GO-derived RGO-metal nanowire films may be deposited from the suspension or ink using a variety of methods, including spray painting, drop casting, spin coating, vacuum-assisted filtration, electrostatic deposition, and dip coating.

In a spray painting process, the solution/suspension/ink can be spray painted onto a heated or non-heated substrate. The substrate may be rinsed during the spraying process to remove the solubilization agent, or surfactant. The spraying solution/suspension/ink may be of any concentration. The substrate surface may be functionalized to aid in adhesion of the deposited species (metal nanowires, CNTs, and/or GO). The spraying rate and the number of spraying passes may be varied to obtain different amounts of deposited species.

In a drop casting process, a drop of the solution/suspension/ink can be placed onto a substrate for a period of time. The substrate may be functionalized to enhance adhesion of deposited species. The substrate with graphene may be rinsed by appropriate solvents. Alternatively, the suspension can be spin-coated along with an appropriate solvent to remove the surfactant simultaneously. In dip coating, the supporting substrate can be dipped into the suspension for a period of time. This may form a film of RGO or RGO/nanowire hybrids. In a printing process, the film may be transferred from one substrate to another by means of a stamp. The stamp may be made from Polydimethyl-siloxane (PDMS). The transfer can be aided by gentle heating (up to 100° C.) and pressure. In a vacuum filtration process, the suspension/ink can be filtered through a porous membrane under the assistance of a vacuum pump. A film of RGO, or RGO-nanowire hybrid is deposited on top of the filtering membrane. The film can be washed while on the filter with a liquid medium to remove surfactant, functionalization agents, or unwanted impurities.

The following examples serve to provide the best modes of practice for the present invention and should not be construed as limiting the scope of the invention:

Example 1

Thermal Exfoliation and Separation of Graphite Oxide

Graphite oxide was prepared by oxidation of graphite flakes with sulfuric acid, nitrate, and permanganate according to the method of Hummers [U.S. Pat. No. 2,798,878, Jul. 9, 1957]. Upon completion of the reaction, the mixture was poured into deionized water and filtered. The graphite oxide was repeatedly washed in a 5% solution of HCl to remove most of the sulphate ions. The GO sample was then washed repeatedly with deionized water until the pH of the filtrate was neutral. After this procedure, we followed two routes to prepare RGO and RGO-metal nanowire suspensions:

In the first route, portion of the GO-deionized water suspension (not a GO gel) was cast onto a glass surface to form a GO film, which was then thermally reduced at 150° C. for 2 hours in vacuum and then 500° C. in a flowing nitrogen/hydrogen condition in a tube furnace to obtain a RGO film. Metal nanowires were poured into the remaining portion of the GO suspension, which was cast to form GO-metal nanowire films and then subjected to identical thermal reduction treatments.

In the second route, portion of the GO-deionized water suspension was spray-dried and stored in a vacuum oven at 60° C. for 24 hours. The interlayer spacing of the resulting laminar graphite oxide was determined by the Debye-Scherrer X-ray technique to be approximately 0.73 nm (7.3 Å). Dried graphite oxide powder was then placed in a tube furnace pre-set at a temperature of 1,050° C. for 60 minutes. The resulting exfoliated graphite was subjected to low-power ultrasonication (60 watts) for 10 minutes to break up the graphite worms and separate graphene oxide layers. These GO sheets actually are partially reduced GO since the high exfoliation temperatures allowed some oxygen-containing functional groups to get released. Several batches of graphite oxide (GO) platelets were produced under identical conditions to obtain approximately 2.4 Kg of oxidized NGPs (GO) platelets. Portions of these GO platelets, with and without metal nanowires, were re-dispersed in water in the presence of a surfactant and cast to form RGO and RGO-metal nanowire films.

Example 2

Preparation of Graphene Oxide (GO) Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of <14 μm) were immersed and dispersed in the oxidizer mixture liquid, the suspension or slurry initially appeared optically opaque and dark. The suspension remained opaque during the first 52 hours of reaction. However, the suspension gradually turned optically translucent (a little cloudy) when the reaction time exceeded 52 hours, and the color of the suspension changed from black to dark brown. After 96 hours, the suspension suddenly became an optically transparent solution with light brown color. The solution appeared very uniform in color and transparency, indicating the absence of any dispersed discrete objects. The whole solution behaves like a gel, very similar to a typical polymer gel.

Surprisingly, by casting this GO gel or the GO gel containing metal nanowires on a glass surface and removing the liquid medium from the cast film we obtain a thin film of graphene oxide or GO-metal nanowire that is optically transparent. These thin films look like, feel like, and behave like regular polymer thin films. These films were then thermally reduced at 150° C. for 2 hours in vacuum and then 500° C. in a flowing nitrogen/hydrogen condition in a tube furnace to obtain GO-derived RGO or GO-derived RGO-metal nanowire films.

Example 3

Characterization of Thin Films of Silver Nanowires (AgNW), AgNW/RGO Hybrid (Conventional), and AgNW/RGO (GO-derived) Hybrid Materials Silver nanowires were purchased from Seashell Technologies (La Jolla, Calif., USA) as suspension in isopropyl alcohol with concentrations of 25 mg/ml. A small volume of dispersion was diluted down to approximately 1 mg/ml with isopropyl alcohol. This was subjected to half-an-hour sonication in a sonic bath. Then, this suspension was applied to a 50 mm×100 mm poly(ethylene terephthalate) (PET) substrates by a manually controlled wire-wound, i.e., pushing the suspension on top of the substrate with a rod.

In addition, AgNW films were prepared by spin-coating AgNW inks on glass substrates. To prepare AgNW films on glass substrates, we treated glass substrates with UV/Ozone to make hydrophilic surfaces for AgNW. Then, AgNW ink was spin-coated on a glass substrate and dried at 120° C. for 5 min. Several AgNW films were prepared by changing spin-coating speed from 250 to 2,000 rpm to investigate the effect of spin-coating speed on optical and electrical properties of AgNW films. Transparent electrode films of AgNW-RGO and AgNW-RGO (GO gel-derived) hybrids were also prepared in a similar manner. Separately, the AgNW-RGO hybrid transparent electrode films were prepared by coating RGO or GO gel onto the AgNW film.

Figure 2A:
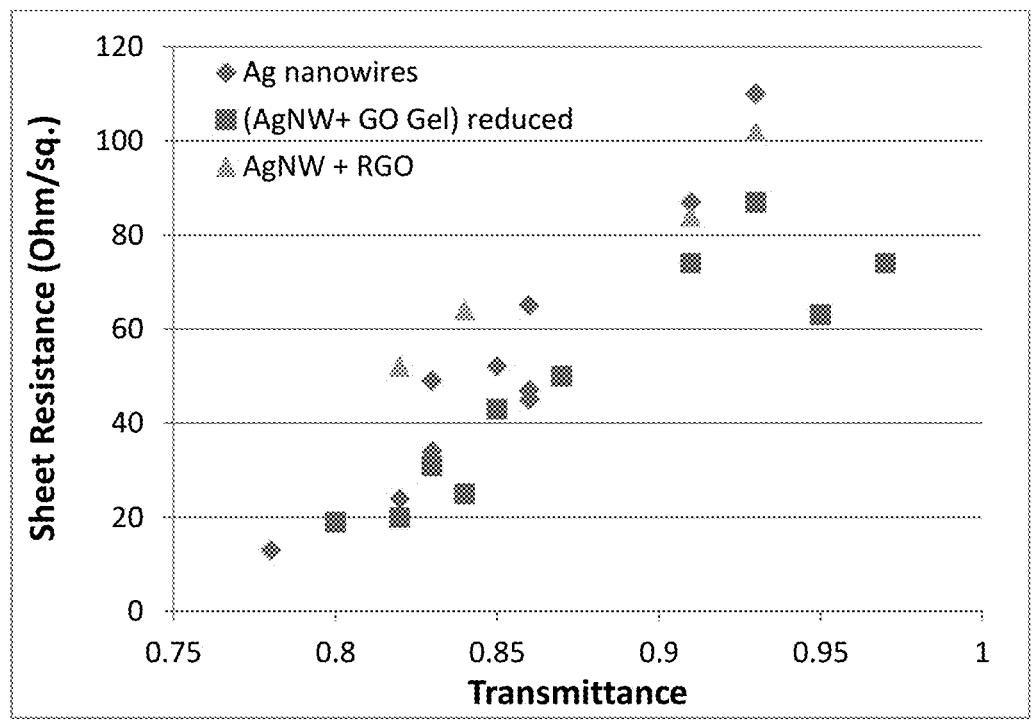
FIG. 2(a) Sheet resistance and optical transmittance (at 550 nm wavelength) of various AgNW, conventional AgNW-RGO, and the new AgNW-RGO (GO gel derived) films; (b) Sheet resistance and optical transmittance (at 550 nm wavelength) of various conventional AgNW-RGO and new AgNW-RGO (GO gel derived) films.
Figure 2B:
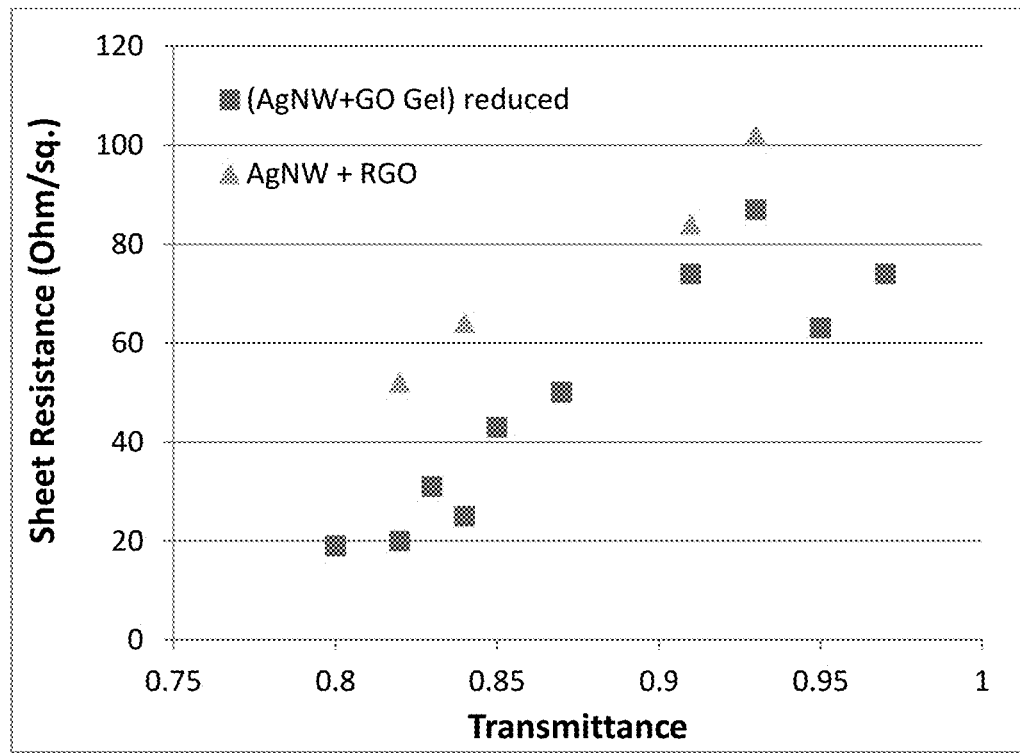

An UV/Vis/NIR was used to measure the optical transmittance of AgNW, AgNW-RGO, and AgNW-(GO gel-derived) films. The sheet resistances were measured by a non-contact Rs measurement instrument. The sheet resistance and optical transparency data are summarized in FIGS. 2(a) and 2(b). Several significant observations can be made from these figures: (A) The AgNW-(GO gel-derived) films significantly out-perform both AgNW and conventional AgNW-RGO films in terms of high transmittance and/or low sheet resistance. (B) With hybrid AgNW-(GO gel-derived) films, we were able to achieve a sheet resistance value of 74 and 63Ω/□ at 97% and 95% transmittance, respectively. These values are even superior to those of un-doped CVD graphene or CVD graphene-AgNW films. These outstanding combined performances are achieved by using highly scalable, more cost-effective, less tedious, and vacuum equipment-free processes. This is most surprising considering the notion that RGO would be significantly less conducting as compared to CVD graphene. (C) Sheet resistance values as low as 19Ω/□ have been obtained, which are comparable to those of high-end ITO glass. Yet, thin films of graphene oxide-enhanced metal nanowires are highly flexible and ductile, in contrast to the rigid and brittle ITO-coated polymer or glass. These surprisingly low sheet resistance values were achieved at an optical transmittance higher than 80%.

Example 4

Copper Nanowire (CuNW) Film, RGO Film, CuNW/RGO Hybrid Film, CuNW/(GO Gel-derived) Film The preparation of CuNW followed the approach of a self-catalytic growth of Cu nanowires within a liquid-crystalline medium of hexadecylamine (HAD) and cetyltriamoninum bromide (CTAB). HDA and CTAB were first mixed at elevated temperature to form a liquid-crystalline medium. Upon addition of the precursor, copper acetylacetonate [Cu(acac)2], long nanowires with excellent dispersibility form spontaneously within the medium in the presence of a catalytic Pt surface. Specifically, a solution process was followed to prepare copper nanowires (CuNWs). As an example, 8 g HAD and 0.5 g CTAB were dissolved in a glass vial at 180° C. Then, 200 mg copper acetylacetonate was added and magnetically stirred for 10 minutes. Subsequently, a silicon wafer (0.5 cm2) sputtered with ~10 nm of platinum was placed into the vial. The mixtures were then kept at 180° C. for 10 hours, resulting in the formation of reddish cotton-like sheets settled at the bottom. After rinsing with toluene for several times, the nanowires were dispersed in toluene at different solid contents. The suspensions were separately cast into thin films on glass or PET surface. Several CuNW films supported on glass or PET substrate were then deposited with either RGO film or GO gel-derived RGO film. Finally, CuNWs were also dispersed into GO gel and cast into thin films and heat treated according to a procedure described in Example 2.

Figure 3:
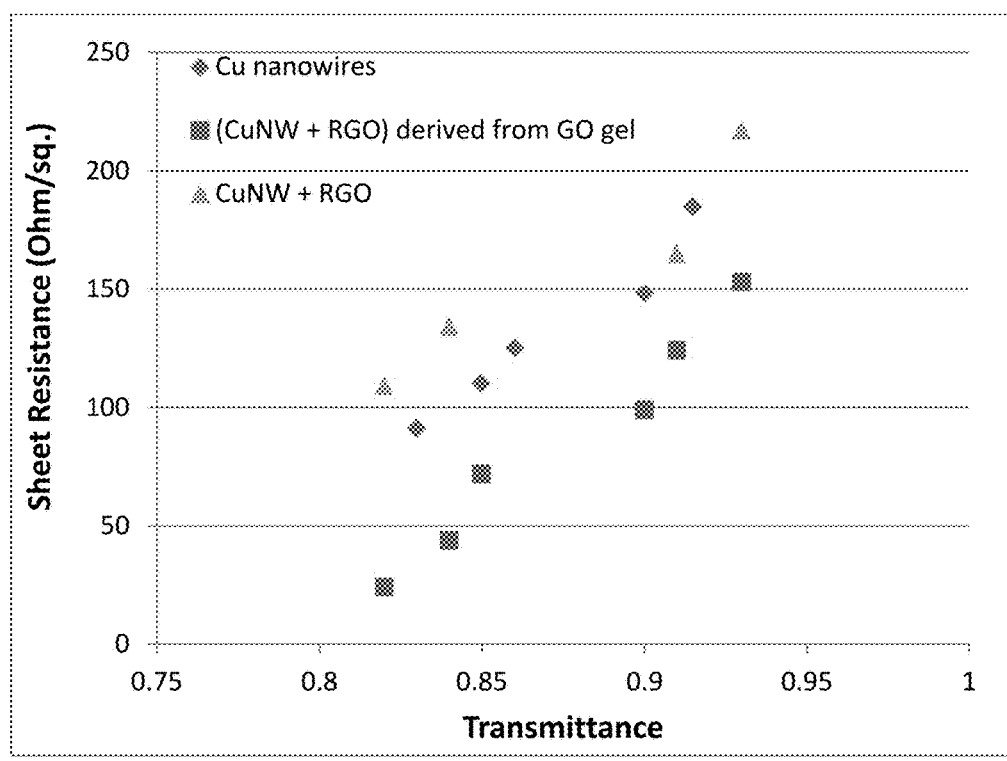
FIG. 3 Sheet resistance and optical transmittance (at 550 nm wavelength) of various CuNW, CuNW-RGO (conventional), and new CuNW-RGO (GO gel derived) films.

The sheet resistance and optical transparency data are summarized in FIG. 3. Several significant observations can be made by examining the data from this chart: (A) The CuNW-(GO gel-derived) films significantly out-perform both CuNW and conventional CuNW-RGO films in terms of high transmittance and/or low sheet resistance. (B) With hybrid CuNW-RGO (GO gel-derived) films, we were able to achieve sheet resistance values of 153 and 124Ω/□ at 93% and 91% transmittance, respectively. These values are superior to those of all CuNW-based electrodes ever reported. These outstanding combined performances are achieved by using highly scalable, more cost-effective, less tedious, and vacuum equipment-free processes. (C) Sheet resistance values as low as 44 and 24Ω/□ have been obtained, which are comparable to those of ITO glass. These surprisingly low sheet resistance values were achieved at an optical transmittance of 82% and 84%, respectively. These are most impressive and surprising considering the fact that the electrical conductivity of Cu is an order of magnitude lower than that of silver and, hence, one would not have expected such a low sheet resistance associated with CuNW even when in combination with graphene-type material, which is even lower than Cu in electrical conductivity.

In summary, a novel and unique class of transparent and conductive electrodes has been developed. This new class of hybrid materials surprisingly offers the following special features and advantages:

(a) Thin films containing networks of metal NWs combined with GO gel-derived reduced graphene oxide sheets (RGO) prepared through solution processing techniques are a promising replacement to ITO glass due to its exceptionally high conductivity (low resistance) and optical transmittance. The superior performance of GO-derived RGO-AgNW electrodes with minimal contact resistance (at RGO-AgNW and AgNW—AgNW interfaces) make them particularly suitable for use in various electro-optic devices, such as a touch screen for a smart phone or tablet computer, organic solar cell, photo-detector, and display device.

(b) GO gel enables the elimination of electrically insulating metal oxide or metal compound from metal nanowire surfaces. This unexpected benefit makes the GO-derived RGO (with metal nanowires being mixed in GO gel prior to GO reduction) significantly more effective than many graphene-based materials in terms of imparting electrical conductance to the metal nanowire films without compromising the optical transmittance. This has been most surprising.

(c) Even though Cu has a much lower electrical conductivity as compared with silver, the CuNW-RGO electrodes, when prepared from the GO gel route as herein disclosed, still surprisingly provide excellent combination of high optical transparency and low sheet resistance.

(d) The presently invented RGO-metal NW films are particularly useful for organic optoelectronic devices such as organic photovoltaic cells, organic light-emitting diodes, and organic photo-detectors because they can be deposited on flexible, light-weight substrates using low-cost fabrication methods. These films are of high flexibility and structural integrity. We have observed that these films can be repeatedly bent back and forth for many times without losing the transmittance and sheet resistance properties.

(e) An important aspect of optoelectronic thin-film devices is the transparent, conductive electrode through which light couples in or out of the devices. Indium tin oxide (ITO) is widely used but is too expensive for applications such as solar cells. Moreover, metal oxides such as ITO are brittle and therefore of limited use on flexible substrates. The present invention provides a substitute for ITO since the GO gel-derived RGO-metal NW films deliver similar sheet resistance and transparency performance, but are of higher flexibility and lower cost.

We claim:

1. An optically transparent and electrically conductive film comprising metal nanowires and graphene oxide or reduced graphene oxide, having a metal nanowire-to-graphene oxide weight ratio of from 1/9 to 9/1, wherein said metal nanowires are free of surface-borne metal oxides or metal compounds, wherein said film exhibits an optical transparence no less than 85% and sheet resistance from 19 ohm/square to 50 ohm/square, and wherein said film further comprises carbon nanotubes, carbon nanofibers, or a combination thereof.

2. The optically transparent and electrically conductive film of claim 1, wherein said metal nanowires have a length to thickness or diameter ratio greater than 3 and the smallest dimension of said metal nanowires is no greater than 200 nm.

3. The optically transparent and electrically conductive film of claim 1, wherein the smallest dimension of said metal nanowires is no greater than 100 nm.

4. The optically transparent and electrically conductive film of claim 1, wherein said metal nanowires are selected from the group consisting of silver (Ag), gold (Au), copper (Cu), platinum (Pt), zinc (Zn), cadmium (Cd), cobalt (Co), molybdenum (Mo), aluminum (Al), alloys thereof, and combinations thereof.

5. The optically transparent and electrically conductive film of claim 1, wherein said metal nanowires contain silver (Ag) nanowires.

6. The optically transparent and electrically conductive film of claim 1, wherein said metal nanowires contain copper (Cu) nanowires.

7. The optically transparent and electrically conductive film of claim 1, wherein said metal nanowires are composed of a transition metal or an alloy of a transition metal.

8. The optically transparent and electrically conductive film of claim 1, wherein said metal nanowires are embedded in said graphene oxide.

9. The optically transparent and electrically conductive film of claim 1, wherein said film is supported on a transparent substrate.

10. The optically transparent and electrically conductive film of claim 9, wherein said transparent substrate is a glass or a polymer.

11. The optically transparent and electrically conductive film of claim 10, wherein said polymer is selected from the group consisting of polyethylene terephthalate (PET) and polycarbonate.

12. The optically transparent and electrically conductive film of claim 9, wherein said transparent substrate has chemical functional groups on the surface.

13. The optically transparent and electrically conductive film of claim 1, wherein said film is patterned.

14. The optically transparent and electrically conductive film of claim 1, wherein said film is coated onto two planar surfaces of a transparent substrate.

15. The optically transparent and electrically conductive film of claim 1, where said graphene oxide has an oxygen content from 2 weight % to 20 weight % on a dry weight basis.

16. The optically transparent and electrically conductive film of claim 1, where said graphene oxide or reduced graphene oxide-comprises single layer graphene oxide having a thickness of less than 10 atomic planes.

17. The film of claim 1, wherein said film exhibits an optical transparence no less than 90% and sheet resistance from 19 ohm/square to 100 ohm/square.

18. The film of claim 1, wherein said film has an average thickness from 0.34 nm to 10 nm.

19. The film of claim 1, wherein said film has an average thickness from 10 nm to 100 nm.

20. The film of claim 1, wherein said film has an average thickness from 100 nm to less than 1 μm.

21. An electro-optic device comprising the optically transparent and electrically conductive film of claim 1 as an electrode.

22. An electro-optic device comprising the film of claim 1, which device is a photovoltaic or solar cell, organic solar cell, light-emitting diode, photo-detector, touch screen, electro-wetting display, liquid crystal display, plasma display, LED display, a TV screen, a computer screen, or a mobile phone screen.

* * * * *